United States Patent
Mautz et al.

(10) Patent No.: US 6,650,135 B1
(45) Date of Patent: Nov. 18, 2003

(54) MEASUREMENT CHUCK HAVING PIEZOELECTRIC ELEMENTS AND METHOD

(75) Inventors: Karl Mautz, Dresden (DE); John Maltabes, Dresden (DE); Alain Charles, Dresden (DE)

(73) Assignee: Motorola, Inc., Schaumburg, IL (US)

( * ) Notice: Subject to any disclaimer, the term of this patent is extended or adjusted under 35 U.S.C. 154(b) by 96 days.

(21) Appl. No.: 09/606,996

(22) Filed: Jun. 29, 2000

(51) Int. Cl.[7] .............................................. G01R 31/26
(52) U.S. Cl. ..................... 324/765; 324/158.1
(58) Field of Search ................. 324/765, 757, 324/755, 760, 754; 310/328; 356/514

(56) References Cited

U.S. PATENT DOCUMENTS

| | | | |
|---|---|---|---|
| RE31,053 E | 10/1982 | Firtion et al. .................. 355/77 |
| 4,506,154 A | 3/1985 | Scire ....................... 250/442.1 |
| 4,506,184 A | 3/1985 | Siddall | |
| 4,666,291 A | 5/1987 | Taniguchi et al. | |
| 5,055,780 A | * 10/1991 | Takagi et al. ................ 324/754 |
| 5,094,536 A | * 3/1992 | MacDonald et al. ......... 356/514 |
| 5,179,333 A | * 1/1993 | Washizuka et al. .......... 324/765 |
| 5,197,089 A | 3/1993 | Baker .......................... 378/34 |
| 5,298,975 A | 3/1994 | Khoury et al. ............... 356/375 |
| 5,410,259 A | * 4/1995 | Fujihara et al. .............. 324/758 |
| 5,585,629 A | 12/1996 | Doran et al. ................. 250/310 |
| 5,773,987 A | 6/1998 | Montoya ..................... 324/757 |
| 5,805,290 A | 9/1998 | Ausschnitt et al. .......... 356/401 |
| 5,863,340 A | 1/1999 | Flanigan ..................... 118/728 |
| 5,868,896 A | 2/1999 | Robinson et al. ............ 156/344 |
| 5,904,800 A | 5/1999 | Mautz ......................... 156/345 |
| 5,978,078 A | 11/1999 | Salamati-Saradh et al. . 356/237 |
| 5,982,166 A | 11/1999 | Mautz ...................... 324/158.1 |
| 5,996,415 A | 12/1999 | Stanke et al. | |
| 6,084,215 A | * 7/2000 | Furuya et al. ............... 324/760 |
| 6,114,865 A | * 9/2000 | Lagowski et al. ........... 324/755 |
| 6,118,290 A | * 9/2000 | Sugiyama et al. ........... 324/754 |
| 6,121,783 A | * 9/2000 | Horner et al. ............... 324/757 |
| 6,198,298 B1 | * 3/2001 | Nishioki ...................... 324/754 |
| 6,313,567 B1 | * 11/2001 | Maltabes et al. ............ 310/328 |

FOREIGN PATENT DOCUMENTS

JP 05129421 5/1993

* cited by examiner

*Primary Examiner*—Vinh P. Nguyen
(74) *Attorney, Agent, or Firm*—James L. Clingan, Jr.

(57) ABSTRACT

A metrology and probe chuck (100) holds a flat object (150), such as a semiconductor wafer (150) at the backside (152). The chuck has, supported on a base plate (105), a plurality of pins (110-n) to receive partial forces ($F_n$) from the backside (152) and a plurality of piezoelectric elements (120-n) attached to the pins to sense the partial forces ($F_n$) applied from the object (150) to the pins (110-n). The piezoelectric elements (120-n) apply partial displacements ($B_n$) of the pins (110-n) to act on selected areas of the object (150) and thereby compensate for irregularities in the backside contour.

17 Claims, 3 Drawing Sheets

US 6,650,135 B1

MEASUREMENT CHUCK HAVING PIEZOELECTRIC ELEMENTS AND METHOD

RELATED APPLICATION

The present application is related to the commonly assigned Urn,ed States application "Lithography chuck havino olezoelectric elements and method" by Mautz et. al., identified by attorney docket number SC0105WD, having Ser. No. 09/546,203, filed Apr. 10, 2000.

FIELD OF THE INVENTION

The present invention generally relates to measuring semiconductor wafers being an intermediate product in the fabrication of integrated circuits (ICs), and, more particularly, relates to an apparatus and to a method for supporting wafers during measurement.

BACKGROUND OF THE INVENTION

In semiconductor manufacturing, structures are obtained on semiconductor wafers or substrates to form a variety of electronic components on the wafer, such as transistors. The wafers are processed, for example, by well-known lithography and etching steps in chambers. Due to variations in the process steps, the frontside of the wafers are continually monitored to determine if the dimensions of the structures (e.g., width and depth of a trench) are within acceptable range. Such monitoring, generally referred to as "metrology" is performed by well-known metrology tools that comprise, for example, scanning electron microscopes (SEM), optical measurement devices, laser interferometers, atomic force microscopy (AFM) devices, or the like. The structure dimensions can also be investigated by probe tools.

Metrology tools provide information on critical processing features (such as pattern critical dimensions on the wafer) during manufacturing. Probe tools give information on the performance of the component (such as speed and functionality) after manufacturing is completed (or nearly completed).

Both for metrology tools and for probe tools, the distance (Z direction) between tool and wafer is of major importance and should be maintained substantially constant for all XY coordinates of the wafer. During measuring, the wafer is supported by a chuck that allows fine displacement of the Z direction.

However, chucks are susceptible to wafer backside contamination resulting in a substantial non-uniformity of the distance between the frontside of the wafer and the metrology tool. This is not desired.

The present invention seeks to provide an improved chuck as well as a method that mitigate or avoid disadvantages and limitations of the prior art.

DETAILED DESCRIPTION OF A PREFERRED EMBODIMENT

The present invention provides an improved measurement chuck that is especially useful for holding large wafers, such as having a diameter D of, for example, 300 millimeter and other large substrates, such as for example, flat panel displays. The term "measurement chuck" is used here collectively for any chuck that is used to hold the wafer for metrology or probing purposes.

Figure 1A:
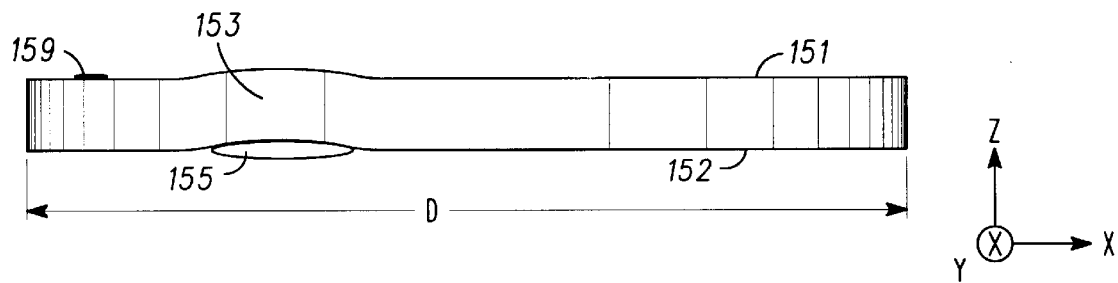
FIGS. 1A–1B illustrate simplified side-view and top-view diagrams of a semiconductor substrate having a backside defect.
Figure 1B:
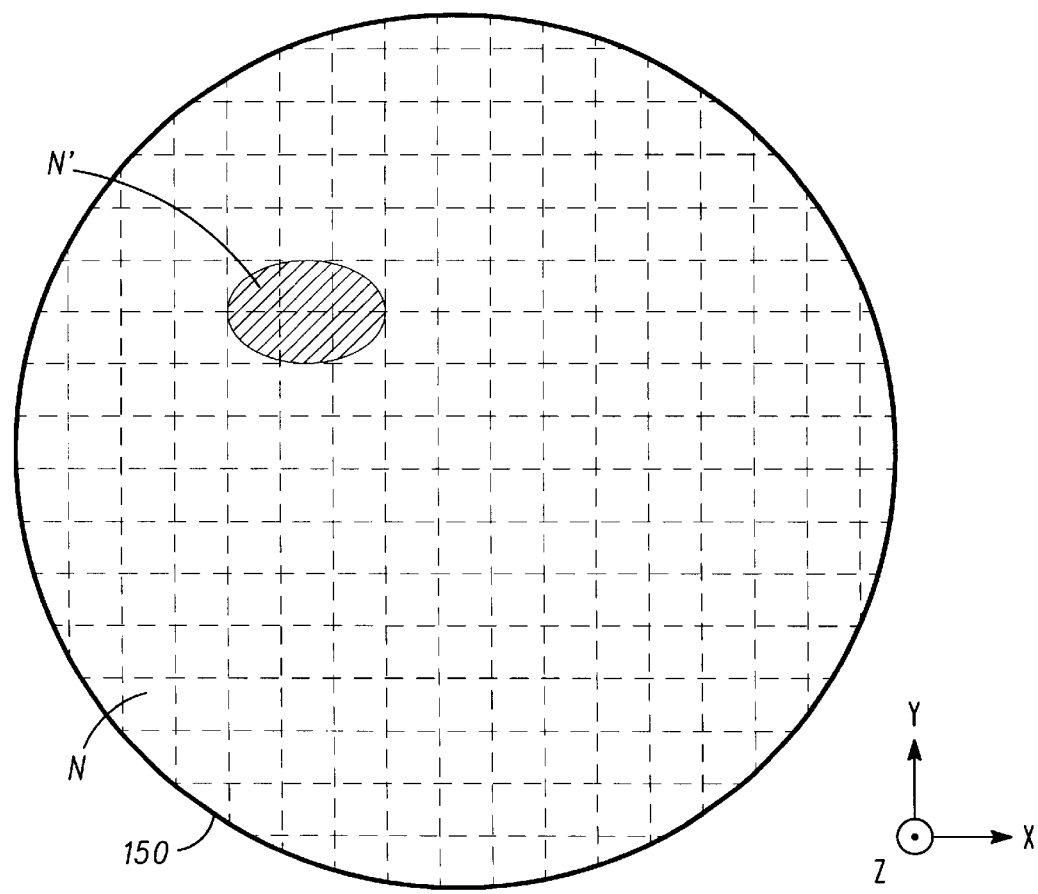

FIG. 1 illustrates simplified side-view and top-view diagrams of flat object 150 having frontside surface 151 and backside surface 152. Object 150 is, preferably a semiconductor wafer, but can also be a flat panel display or other electronic component to be measured. Object 150 is hereinafter referred to as "wafer". For convenience of explanation, FIG. 1 introduces rectangular coordinate system XYZ with the X-axis going right, the Y-axis going into the page, and the Z-axis going up. Coordinate system XYZ illustrates the extension of wafer 150. For an ideal wafer, the Z-coordinate of the backside would be equal across the wafer (e.g., Z=0 at backside 152).

Backside defect 155 stands here for any irregularity on backside 152. Defect 155 causes a backside contour where some Z-coordinates have a positive or negative offset from zero; and defect 155 might elevate portion 153 of wafer 150 into Z-direction. This is not desired and would influence the measurement result.

Defects 155 on the backside can be, for example, (a) photoresist or other evaporated solvent residue from a previous coating step; (b) particles (e.g., silicon dust and film particles); (c) irregularities such as, for example, backside film thickness variations; (d) clip marks, boat marks, or clamp marks.

The top view of wafer 150 illustrates dashed grid lines that—for convenience of explanation only—divide wafer into N areas each having, preferably, the same dimensions. A number of N' areas that are illustrated hashed is elevated due to defect 155 (N'<N). Usually, the edge of wafer 150 is sealed to the chuck to prevent air leakage. However, a warped wafer or contamination could disturb this so that chuck vacuum errors could occur.

It is further desirable to minimize the contact that the chuck has on wafer backside 152 ("contact percentage") to minimize the impact of defect 155 (backside particles) and prevent contamination from being transferred to the chuck. However, sufficient contact is required, for example, to maintain vacuum sealing of the wafer. If backside 152 would be contaminated than the chuck might not operate correctly.

Figure 2:
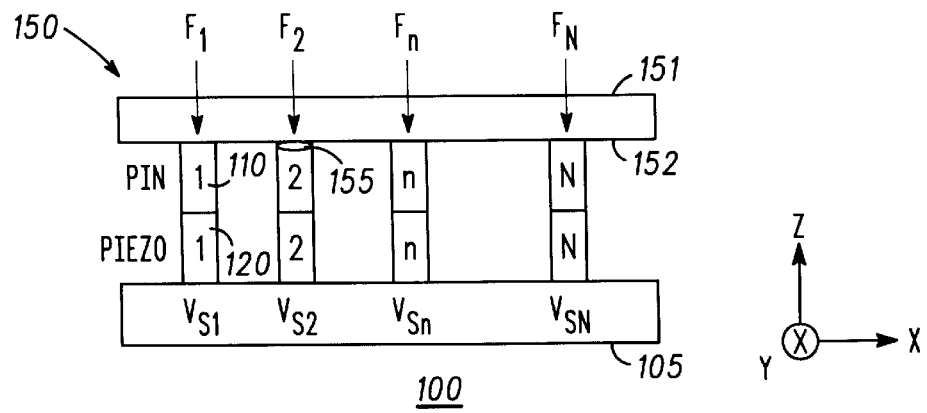
FIG. 2 illustrates a simplified diagram of a measurement chuck according to the present invention.

FIG. 2 illustrates a simplified diagram of measurement chuck 100 to hold wafer 150 at backside 152 according to the present invention. Chuck 100 comprises base plate 105, a plurality of pins 110-n (n=1. . . N), and a plurality of piezoelectric elements 120-n (hereinafter also "piezoelements"). Pins 110-n stand vertically on base plate 105 to receive partial forces $F_n$ from backside 152 of wafer 150; and piezoelectric elements 120-n are attached to pins 110-n to sense the partial forces $F_n$ that wafer 150 applies to pins 110-n. Preferably, piezoelements 120-n are located between pins 110 and base plate 105. Optionally, spaces between pins 110-n are evacuated (vacuum) to pull wafer 150 into the direction of base plate 105. For simplicity, defect 155 (cf. FIG. 1) is illustrated to touch pin 110-2 only.

A combination of a pin and a piezoelement is also referred to as "piezopin". In other words, base plate 105 (or "board") has a piezoelectric sensor grid 120-1 to 120-N with pins 110-1 to 110-N. Preferably, base plate 105 and wafer 150 are surrounded by a housing (not in FIG. 1, cf. FIG. 6). Substantially each pin 110-n is connected underneath to piezoelectric element 120-n (sensor/actuator). There is a piezoelectric element 120-n for each square shown in FIG. 1B. There are at least one hundred piezoelectric elements 120-n.

Elements 120-n operate as sensors to generate sensor voltages $V_{Sn}$ in response to induced stress, for example pressure exerted from deviations (e.g., defect 155) on the backside of the wafer. In other words, piezoelements 120-n output sensor voltages $V_{Sn}$ that are representations of partial forces $F_n$.

In an ideal case, "ultra-flat wafer" (Z equal), variations of the sensor voltages $V_{Sn}$ would be in a predetermined (threshold) voltage range of about 20 or less per cent of the maximum sensor voltage $V_S$ that can be generated (e.g., $V_{S\ MAX} \approx 20$ millivolt).

Having sensor voltages at about zero ($V_S=0$) for a nominal force $F_{NORM}$ (weight of wafer 150 divided by N) is convenient, but not essential for the present invention. The sensors can also generate a sensor offset voltage $V_{S\ OFFSET}$ that is substantially equal for all elements.

In a non-ideal case, for example, for wafer 150 having defect 155, deviations from the range (voltages outside the range) indicate the backside defect. In the example of FIG. 2, defect 155 causes $F_2$ to be larger than the other forces $F_n$ so that $V_{S2}$ is different from the other voltages $V_{Sn}$.

The plurality of sensor voltages $V_{Sn}$ creates a profile map that indicates the locations (e.g., XY coordinates) of wafer backside defect 155 (cf. FIG. 1, grid lines) ("topography effects").

As it will be explained with more detail later, the present invention allows to compensate for wafer defect 155 by laying wafer 150 on the plurality of pins 110-n of chuck 100, sensing for each pin 110-n a gravitational force (i.e., $F_n$) with elements, and actuating with elements 120-n.

Using chuck 100 of the present invention has a number of advantages over the prior art. For example, the focusing of light beam in optical tools can be made more accurate. If vacuum is used, the present invention offers the further advantage that warped wafers would also be made flatter by this technique. This is a desired feature for probe tools and some metrology tools to obtain repeatable measurements and correct positioning over the wafer by the measurement device (cf. 102 in FIG. 7).

Figure 3:
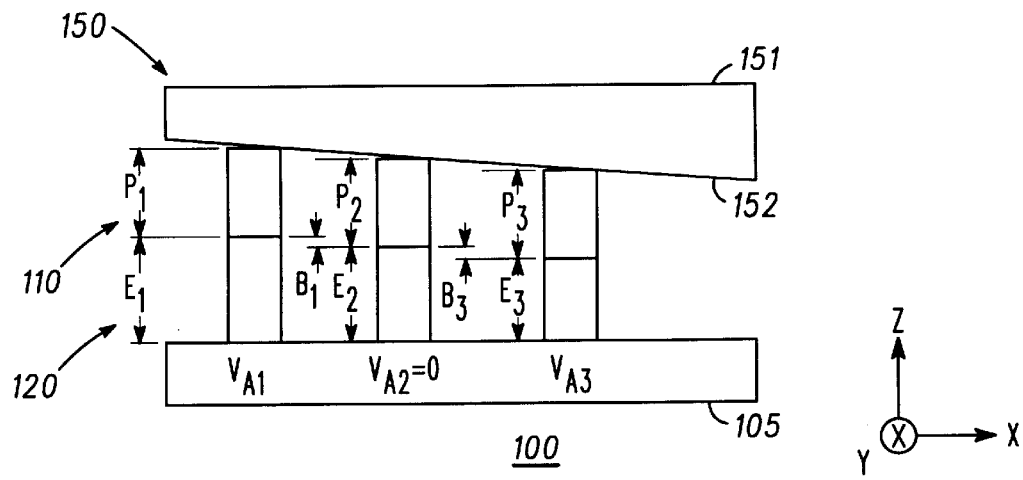
FIG. 3 illustrates a simplified diagram of a pin-piezoelement arrangement in the chuck of FIG. 2.

FIG. 3 illustrates a simplified diagram of a pin-piezoelement arrangement 110/120 in chuck 100 of FIG. 2. For example, FIG. 3 shows, conveniently very much simplified, pins 110-1, 110-2, 110-3, elements 120-1, 120-2, 120-3 and wafer 150 with a defect that lead to backside contour in form of a wedge.

Pins 110-n have substantially equal vertical dimensions $P_n$. For compensation (i.e., of defect 155 or other backside variation), piezoelements 120-n operate as actuators with variable vertical dimensions $E_n$. Both dimensions add to variable height $H_n=P_n+E_n$.

Piezoelements 120-n apply partial displacements $B_n$ ("shift") of pins 110-n to act on selected areas (cf. grid in FIG. 1) of wafer 150 when receiving actuator voltages $V_{An}$. The displacement is conveniently referred to a non-energized piezoelement; in the example to element 120-2 where $V_{A2}=0$ and $B_2=0$.

Pins 110-n are allowed to move up and down, such as with a positive $B_1$ driven by element 120-1, and a negative $B_3$ driven by element 120-3. Frontside 151 becomes substantially coplanar to the XY-plane. The displacement can also be considered as changing the height (e.g., $H_1$, $H_2$, $H_3$) where pins 110-n touch wafer backside 152.

In other words, a first subset of the plurality of piezoelements 120-n applies positive partial displacement towards wafer 150 (e.g., element 120-1, to expand piezopin 1, left side); and a second subset of the plurality of piezoelements 120-n applies negative partial displacement towards base plate 105 (e.g., element 120-3, shrink piezopin 3, right side).

Having defined actuator voltages $V_A$ at zero in case of zero-displacement (i.e., $V_A=0$, B=0) is convenient for explanation, but not limited to the present invention. Optionally, actuator voltages $V_A$ of all piezoelements 120-n can be biased by an substantially equal offset voltage $V_{A\ OFFSET}$. Biasing is useful to fine-tune the position of wafer 150 in respect to the Z-axis.

Non-equal actuator offset voltages $V_{A\ OFFSET}$ that depend on either the X-coordinate (i.e., $V_{A\ OFFSET}=f(X)$) or the Y-coordinate (i.e., $V_{A\ OFFSET}=f([X]\ Y)$), or that depend on both coordinates, $V_{A\ OFFSET}=f(X,Y)$) can equalize any imbalance of chuck 100 from an ideal XY plane.

Figure 4:
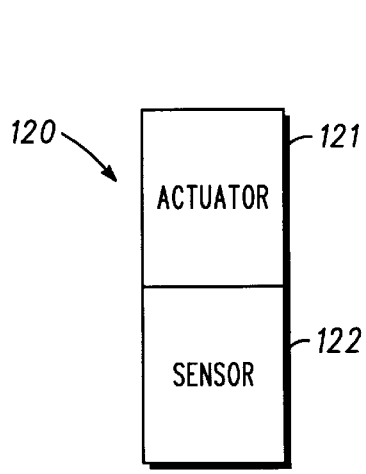
FIG. 4 illustrates a simplified diagram of a piezoelectric element having a sensor part and an actuator part.

FIG. 4 illustrates a simplified diagram of piezoelectric element 120 having sensor part 122 and actuator part 121 separated. This is convenient, but not essential. It is well known in the art that a single piezoelement can operate either as a sensor or as an actuator (inverse nature of piezoelectric effect).

Figure 5:
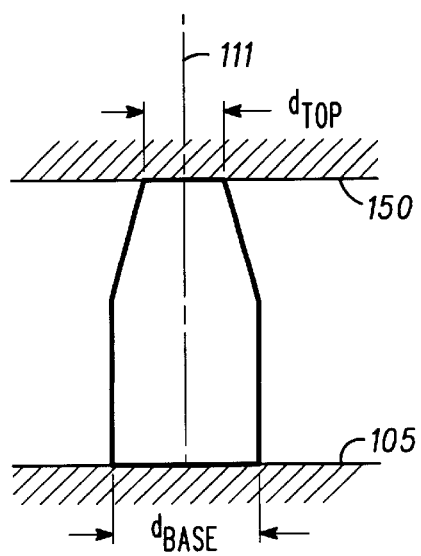
FIG. 5 illustrates a simplified diagram of an optional embodiment of the pin-piezoelement arrangement in the chuck of FIG. 2.

FIG. 5 illustrates a simplified diagram of an optional embodiment of pin-piezoelement arrangement 110/120 located between wafer 150 and base plate 105. It is only the intention of FIG. 5 to illustrate that the top and base areas by which piezopin 110/120 touches wafer 150 and base plate 105, respectively, can be different (preferably, base area larger than top area). For simplicity, any distinction between pin 110 and piezoelement 120 is therefore left out. Dot-dash line 111 is a center line.

As illustrated by example, piezopin 110/120 can have the shape of a cylinder (base diameter $d_{BASE}$) that tapers into a truncated cone (top diameter $d_{Top}$). A useful range for the top diameter $d_{Top}$ is between 100 and 2000 micrometer, wherein the range between 100 and 200 micrometer is preferred. Pin tapering contributes to a preferred contact area reduction.

Figure 6:
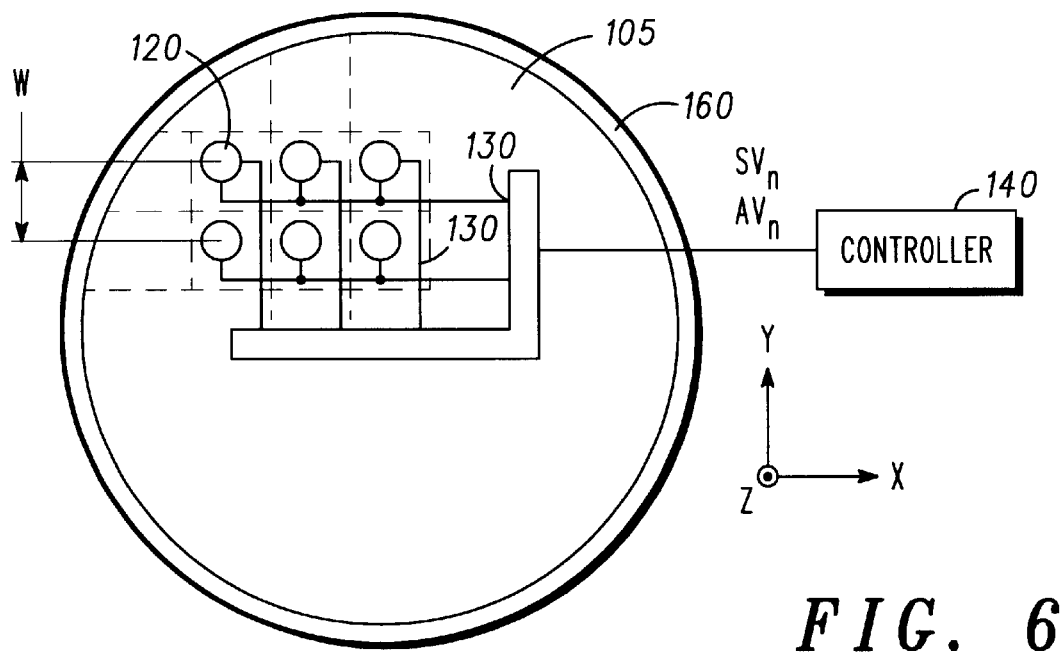
FIG. 6 illustrates a simplified diagram of a base plate of the chuck having circuitry coupled to a controller.

FIG. 6 illustrates a simplified diagram of base plate 105 of chuck 100 with elements 120-n and circuitry 130 coupled to external controller 140. Conveniently, FIG. 6 also illustrates the areas by the dashed grid line introduced in FIG. 1.

Circuitry 130 forwards sensor voltages $V_{Sn}$ to external controller 140 and forwards actuator voltages $V_{An}$ from controller 140. Conveniently, FIG. 6 also illustrates housing 160 to surround plate 105.

Controller 140 can also be a micro-controller-unit (MCU). Circuitry 130 can forward the sensor voltages $V_{Sn}$ and the actuator voltages $V_{An}$ consecutively, that means, first the sensor voltages, and second the actuator voltages.

Circuitry 130 can be implemented such as to forward sensor $V_{Sn}$ and actuator $V_{An}$ voltages substantially simultaneously for all piezoelectric elements 120-n; or to forward sensor $V_{Sn}$ and actuator $V_{An}$ voltages consecutively for rows and columns of piezoelements 120-n.

Preferably, controller 140 controls each piezoelement 120-n independently. In other words, each pin 110-n becomes adjustable to the contour on wafer backside 152 (minimizing backside particle topography) to maintain flatness (Z-coordinate) of wafer 150 and—if used vacuum—sealing of wafer 150.

In other words, piezoelectric elements 120-n vary the effective area (i.e. top areas) in which pins 110-n touch selected areas of object 150 differently to provide an area specific vacuum force.

It is an advantage of the present invention that the unwanted effects of particle or contamination impacts (cf. defect 155) on the backside are compensated.

Although the example of FIG. 6 illustrates elements 120-n by circles (top view of cylinders as in FIG. 5), those of skill in the art are able to implement elements 120-n and pins 110-n in various other shapes or profiles, such as squares or hexagons. Having illustrated circuitry 130 with electrical conductors at the top of plate 105 between elements 120-n is convenient, but not essential. The conductors can also be located elsewhere, for example, below elements 120-n, i.e. inside base plate 105.

The number N' of areas affected by defects 155 is not important. The present invention can accommodate both large backside contamination areas such as organics or film irregularities as well as small submicron particles.

Once the compensation has occurred, the current pin location (cf. FIG. 3, adjusted height $H_1$, $H_2$, $H_3$) can be maintained, for example, by (i) continued application of actuator voltage $V_{An}$ to elements 120-n; (ii) exertion of a rotation force to lock-in pins 110-n to plate 105 (e.g., pin design has a cam mechanism to act as a wedge); or (iii) application of an electromagnetic field to lock pins 110-n in-place within plate 105.

Figure 7:
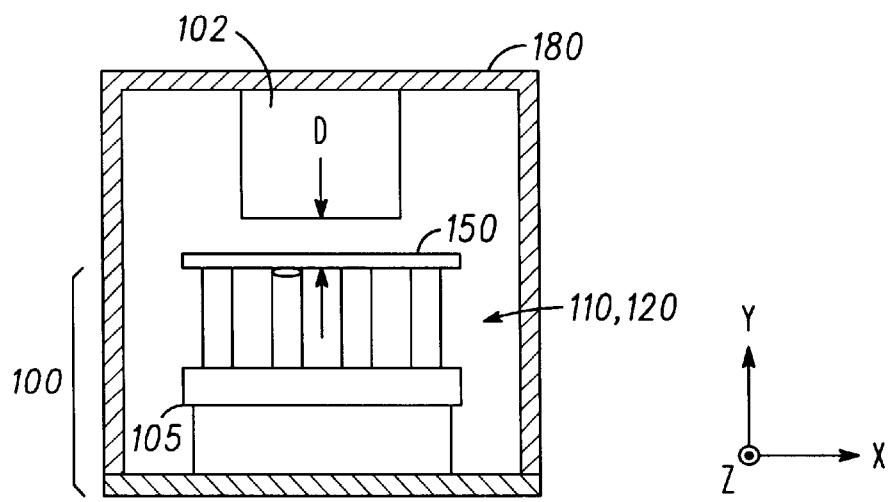
FIG. 7 illustrates a simplified diagram of a wafer measuring apparatus with a measuring chamber, a metrology or probe tool, and a chuck according to the present invention.

FIG. 7 illustrates a simplified diagram of wafer measuring apparatus 101 with measuring chamber 180 and chuck 100 according to the present invention. Besides metrology tool 102, apparatus 101 comprises base plate 105 suspended in chamber 180, a plurality of pins 110 standing vertically on base plate 105, and a plurality of piezoelectric elements 120 attached to pins 110. As explained in detail above, pins 110 receive partial forces from backside 152 of wafer 150 and provide a contour representation in the form of a sensor voltage vector. Piezoelectric elements 120 sense the different partial forces that result from irregularities (backside contour) and partially (i.e. locally) apply compensating displacements of pins 110 in correspondence to the sensed partial forces when receiving an actuator voltage vector. The distance D between metrology tool 102 and wafer 150 in Z direction is substantially independent from the XY coordinates.

The application of a flatness standard instead of the wafer can be used to detect whether cleaning is necessary or whether a damage has occurred to the pin and piezoelement arrangement (self-diagnostic).

A systematic problem in chuck 100 can be detected by continuously monitoring the corrections (e.g., $V_S$, $V_A$) from wafer to wafer that goes through chuck 100.

As a diagnostic tool, chuck 100 can be used to investigate known and measurable flatness deviations. For example, predetermined patterns can be printed on the wafers to study of ability of chuck 100 to correct defects (and therefore to improve the resultant image quality). These studies would add an extra dimension to focus/exposure data, with wedge or non-flatness effects added in. The chuck can be cleaned by temporarily inserting elements 120 into base plate 105.

A method according to the present invention for holding a semiconductor wafer in a metrology chamber (cf. FIG. 7) substantially coplanar to a reference plane (cf. FIG. 1, XY with equal Z) can be described as follows:

In a coupling step, the wafer is coupled to a plurality of pins being arranged substantially perpendicular to the wafer. In a measuring step, piezoelements that are attached to the plurality of pins measure a plurality of sensor voltages that represent a backside contour of the wafer. In a displacing step, some of the pins are displaced in correspondence to the backside contour by applying actuator voltages to the piezoelements.

While the invention has been described in terms of particular structures, devices and methods, those of skill in the art will understand based on the description herein that it is not limited merely to such examples and that the full scope of the invention is properly determined by the claims that follow.

What is claimed is:

1. An apparatus, comprising:
   a measurement chuck to hold a flat object at the backside, said chuck comprising:
      a base plate;
      a plurality of pins standing vertically on said base plate to receive partial forces from said backside of said object; and
      a plurality of piezoelectric elements attached to said pins to sense the partial forces applied from said object to said pins; and
   a metrology tool over the chuck.

2. The chuck of claim 1 wherein said piezoelectric elements are located between said pins and said base plate.

3. The chuck of claim 1 wherein said piezoelectric elements provide representations of said partial forces by sensor voltages.

4. The chuck of claim 1 wherein said piezoelectric elements apply partial displacements of said pins to act on selected areas of said object when receiving actuator voltages.

5. The chuck of claim 4 wherein said piezoelectric elements are biased by a substantially equal offset voltage to fine-tune the position of said object.

6. The chuck of claim 4 wherein a first subset of said plurality of said piezoelectric elements applies positive partial displacements towards said object.

7. The chuck of claim 4 wherein a second subset of said plurality of said piezoelectric elements applies negative partial displacements towards said base plate.

8. The chuck of claim 4 wherein said base plate comprises circuitry to forward said sensor voltages to an external controller and said actuator voltages from said controller.

9. The chuck of claim 8 wherein said circuitry forwards said sensor voltages and said actuator voltages consecutively.

10. The chuck of claim 8 wherein said circuitry forwards said sensor and actuator voltages substantially simultaneously for all piezoelectric elements.

11. The chuck of claim 8 wherein said circuitry forwards said sensor and actuator voltages consecutively for rows and columns of piezoelectric elements.

12. The chuck of claim 8 wherein said controller controls each piezoelectric element independently.

13. The chuck of claim 1 wherein said object is a semiconductor substrate.

14. The chuck of claim 4 wherein each of said piezoelectric elements comprises a sensor part and an actuator part.

15. The chuck of claim 1, wherein the plurality of pins comprises at least one hundred pins in parallel.

16. The chuck of claim 15, wherein the plurality of pins and the plurality of piezoelectric elements are further characterized as being means for compensating for deformities in a semiconductor wafer.

17. A wafer measuring apparatus, comprising:

a measuring chamber; and a measurement chuck, said chuck to hold a wafer at the backside, wherein said chuck comprises:
  a base plate;
  a plurality of pins standing vertically on said base plate to receive partial forces from said backside of said wafer; and
  a plurality of piezoelectric elements attached to said pins to sense different partial forces resulting from irregularities of said backside and to partially apply compensating displacements of said pins in response to said sensed partial forces; and a metrology tool over the chuck.

* * * * *